US012108582B2

(12) United States Patent
Anabuki et al.

(10) Patent No.: US 12,108,582 B2
(45) Date of Patent: Oct. 1, 2024

(54) ELECTRONIC DEVICE PROTECTION UNIT AND ELECTRONIC SYSTEM

(71) Applicant: MITSUBISHI HEAVY INDUSTRIES, LTD., Tokyo (JP)

(72) Inventors: Naohisa Anabuki, Tokyo (JP); Masaki Kusano, Tokyo (JP); Shigeru Ishii, Tokyo (JP)

(73) Assignee: MITSUBISHI HEAVY INDUSTRIES, LTD., Tokyo (JP)

( * ) Notice: Subject to any disclaimer, the term of this patent is extended or adjusted under 35 U.S.C. 154(b) by 611 days.

(21) Appl. No.: 17/293,637

(22) PCT Filed: Feb. 3, 2020

(86) PCT No.: PCT/JP2020/003891
§ 371 (c)(1),
(2) Date: May 13, 2021

(87) PCT Pub. No.: WO2020/175021
PCT Pub. Date: Sep. 3, 2020

(65) Prior Publication Data
US 2022/0015274 A1 Jan. 13, 2022

(30) Foreign Application Priority Data

Feb. 25, 2019 (JP) ................. 2019-031691

(51) Int. Cl.
*H05K 9/00* (2006.01)
*G01N 27/82* (2006.01)
(Continued)

(52) U.S. Cl.
CPC ........... *H05K 9/0071* (2013.01); *G01N 27/82* (2013.01); *G01N 27/9046* (2013.01);
(Continued)

(58) Field of Classification Search
CPC ............ H05K 9/0071; G01N 27/9046; G01N 27/9053; G01N 27/82; G01R 33/07; G01R 33/025; G01R 33/02
(Continued)

(56) References Cited

U.S. PATENT DOCUMENTS 6,125,192 A 9/2000 Bjorn et al.
2002/0079439 A1* 6/2002 Croydon ................. G01T 1/244
250/252.1

(Continued)

FOREIGN PATENT DOCUMENTS

EP 0 902 612 3/1999
JP S61-226919 A 10/1986
(Continued)

OTHER PUBLICATIONS

International Search Report issued Apr. 14, 2020 International (PCT) Application No. PCT/JP2020/003891.
(Continued)

*Primary Examiner* — Raul J Rios Russo
(74) *Attorney, Agent, or Firm* — Wenderoth, Lind & Ponack, L.L.P.

(57) ABSTRACT

An electronic device protection unit is provided. The electronic device protection unit includes a sensing part, a responding part, and an analysis and control part. The sensing part is configured to detect an incident ray which is electromagnetic wave or radiation with potential to cause destruction (damage), failure, or malfunction of an electronic device. The responding part is configured to be able to perform a plurality of behaviors to protect the electronic device. The analysis and control part is configured to control the behaviors of the responding part in response to a type of the incident ray detected by the sensing part.

17 Claims, 13 Drawing Sheets

(51) Int. Cl.
  *G01N 27/90* (2021.01)
  *G01R 33/02* (2006.01)
  *G01R 33/025* (2006.01)
  *G01R 33/07* (2006.01)

(52) U.S. Cl.
  CPC ......... *G01N 27/9053* (2013.01); *G01R 33/02* (2013.01); *G01R 33/025* (2013.01); *G01R 33/07* (2013.01)

(58) Field of Classification Search
  USPC ....................................................... 324/225
  See application file for complete search history.

(56) References Cited

U.S. PATENT DOCUMENTS

| | | | |
|---|---|---|---|
| 2012/0037420 A1* | 2/2012 | Lam | H01Q 15/0013 174/250 |
| 2012/0138600 A1 | 6/2012 | Oomori et al. | |
| 2013/0083493 A1 | 4/2013 | Kurihara et al. | |
| 2014/0239182 A1 | 8/2014 | Ito et al. | |
| 2015/0069846 A1* | 3/2015 | Hokari | G01R 1/18 307/91 |
| 2015/0101860 A1* | 4/2015 | Lam | H01Q 15/006 174/392 |
| 2018/0097284 A1 | 4/2018 | Liff et al. | |
| 2018/0110305 A1* | 4/2018 | Kim | A45C 1/06 |
| 2019/0044246 A1 | 2/2019 | Pitsillides et al. | |
| 2019/0269048 A1* | 8/2019 | Fujita | H01F 1/117 |

FOREIGN PATENT DOCUMENTS

| | | |
|---|---|---|
| JP | 09-237991 | 9/1997 |
| JP | 09-304458 | 11/1997 |
| JP | 11-145675 | 5/1999 |
| JP | 2001-099706 A | 4/2001 |
| JP | 2001-521665 | 11/2001 |
| JP | 2004-361349 A | 12/2004 |
| JP | 2006-261633 A | 9/2006 |
| JP | 2009-288393 | 12/2009 |
| JP | 2010-010303 A | 1/2010 |
| JP | 2013-077701 A | 4/2013 |
| JP | 2014-167443 A | 9/2014 |
| JP | 2015-231070 | 12/2015 |
| JP | 2016-001796 | 1/2016 |
| WO | 2011/021368 | 2/2011 |

OTHER PUBLICATIONS

English translation of the International Preliminary Report on Patentability issued Sep. 2, 2021 in International Application No. PCT/JP2020/003891.
Office Action issued Nov. 22, 2022 in Japanese Patent Application No. 2019-031691, with English translation, 26 pages.
Office Action issued May 16, 2023 in Japanese Patent Application No. 2019-031691, with English translation, 11 pages.

* cited by examiner

Incident Electromagnetic Wave

Incident Radiation

ELECTRONIC DEVICE PROTECTION UNIT AND ELECTRONIC SYSTEM

TECHNICAL FIELD

The present invention relates to electronic device protection unit and electronic system.

BACKGROUND ART

Electronic equipment equipped with an electronic device such as a large scale integrated circuits (LSI) and an electronic circuit may not provide desired functions due to destruction (damage), failure, or malfunction of the electronic device when the electronic equipment is exposed to harsh electromagnetic and/or radiation environment. Depending on the applications, the electronic device may be attacked by intentional electromagnetic and/or radiation irradiation aimed at destruction (damage), failure, or malfunction of the electronic device. The feature of electromagnetic wave or radiation incident on the electronic device, especially with respect to an external attack, may be unpredictable. Therefore, it is to be desired that a protection unit for electronic device takes countermeasure against wide variety of incident electromagnetic wave and radiation threats.

It is noted that US Patent Application Publication No. 2018/0097284 A1 discloses a reconfigurable communications system including a shield comprised of reconfigurable meta-material.

CITATION LIST

Patent Literature

[Patent literature 1] US Patent Application Publication No. 2018/0097284 A1

SUMMARY OF THE INVENTION

One of objectives of the present invention is to provide electronic device protection unit which is able to address various external electromagnetic wave and/or radiation threats. Other objectives and new features of the present invention would be understood by persons skilled in the art from the following disclosure.

In one embodiment, electronic device protection unit includes: a sensing part that detects incident electromagnetic wave or radiation with potential to cause destruction (damage), failure, or malfunction of an electronic device; a responding part configured to be able to perform a plurality of behaviors to protect the electronic device; and an analysis and control part that controls the behaviors of the responding part depending on the feature of the incident ray detected by the sensing part.

In one embodiment, the responding part possesses a reconfigurable electromagnetic shield comprised of electromagnetic meta-material, and the analysis and control part is configured to perform spectrum analysis of external electromagnetic wave incident on the sensing part and to control the electromagnetic property of the reconfigurable electromagnetic shield according to the result of the spectrum analysis.

In one embodiment, the reconfigurable electromagnetic shield is embedded in a casing that accommodates electronic equipment equipped with the electronic device.

In one embodiment, the reconfigurable electromagnetic shield is embedded in an electronic device storing package to cover the electronic device.

In one embodiment, the analysis and control section is configured to perform spectrum analysis of external electromagnetic wave incident on the sensing part, and the responding part is configured to emit canceling wave that cancels out the external electromagnetic wave according to the result of the spectrum analysis.

In one embodiment, the analysis and control part is configured to perform spectrum analysis of external electromagnetic wave incident on the sensing part, and the responding part is configured to emit jamming electromagnetic wave toward an entity that emits the external electromagnetic wave according to the result of the spectrum analysis.

In one embodiment, the sensing part includes a waveguide configured to receive external electromagnetic wave and guide the received external electromagnetic wave; the analysis and control part is configured to generate electromagnetic wave with an antiphase to that of the external electromagnetic wave by controlling the phase of the electromagnetic wave received from the waveguide; and the electromagnetic wave received from the waveguide and the electromagnetic wave with the antiphase are cancelled through superposition.

In one embodiment, the sensing part includes a waveguide configured to receive external electromagnetic wave and guide the received external electromagnetic wave; the analysis and control part is configured to generate electromagnetic wave with an antiphase to that of the external electromagnetic wave by controlling the phase of the electromagnetic wave received from the waveguide; and the responding part is configured to emit cancelling wave produced based on the electromagnetic wave with the antiphase.

In one embodiment, the sensing part includes an electric field sensor; the responding part includes a first protection device, the first protection device being implemented in a power line that supplies a power supply voltage from a power supply unit to the electric device and configured to perform a protection operation in order to prevent a surge from intruding into the electronic device via the power line; and the analysis and control part is configured to control the first protection device depending on an electric field strength measured by the electric field sensor.

In one embodiment, the sensing part includes an electric field sensor; the responding part includes a second protection device, the second protection being implemented in a communication line connected between the electronic device and an external entity and configured to perform a protection operation in order to prevent a surge from intruding into the electronic device via the communication line; and the analysis and control part is configured to control the second protection device in response to an electric field strength measured by the electric field sensor.

In one embodiment, the sensing part includes an electric field sensor, and the analysis and control part is configured to control an operation of the electronic device depending on an electric field strength measured by the electric field sensor.

In one embodiment, the sensing part includes a light receiver that receives light with a wavelength from infrared to ultraviolet; the responding part includes a reconfigurable electromagnetic shield comprised of electromagnetic meta-material; and the analysis and control part is configured to perform spectrum analysis of the light incident on the light receiver and to control an electromagnetic property of the reconfigurable electromagnetic shield according to a result of the spectrum analysis.

In one embodiment, the sensing part includes a light receiver that receives light with a wavelength from infrared to ultraviolet, and the analysis and control part is configured to control an operation of the electronic device based on an intensity of the light incident on the light receiver.

In one embodiment, the sensing part includes an ionizing radiation detector configured to detect ionizing radiation; the responding part includes a first protection device, the first protection device being implemented in a power line that supplies a power supply voltage from a power supply unit to the electric device and configured to perform a protection operation to prevent a surge from intruding into the electronic device via the power line; and the analysis and control part is configured to analyze the ionizing radiation based on an output of the ionizing radiation detector and control the first protection device according to the result of the analysis of the ionizing radiation.

In one embodiment, the sensing part includes an ionizing radiation detector configured to detect ionizing radiation; the responding part includes a second protection device, the second protection device being implemented in a communication line connected between the electronic device and an external entity and configured to perform a protection operation in order to prevent a surge from intruding into the electronic device via the communication line; and the analysis and control part is configured to analyze the ionizing radiation based on an output of the ionizing radiation detector and control the second protection device according to a result of the analysis of the ionizing radiation.

In one embodiment, the sensing part comprises an ionizing radiation detector configured to detect ionizing radiation, and the analysis and control part is configured to analyze the ionizing radiation based on the output of the ionizing radiation detector and control operation of the electronic device according to the result of the analysis of the ionizing radiation.

In one embodiment, an electronic system includes an electronic device and the above-described electronic device protection unit.

The present invention allows providing electronic device protection unit which is able to address wide variety of external electromagnetic wave and/or radiation.

DESCRIPTION OF EMBODIMENTS

In the following, a description is given of embodiments with reference to the attached drawings.

Figure 1:
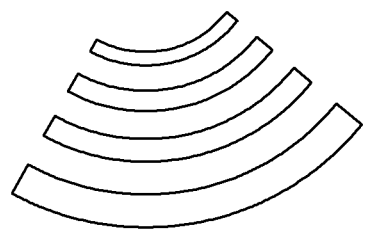
FIG. 1 is a perspective view showing the configuration of an electronic system, according to one embodiment.
Figure 1:
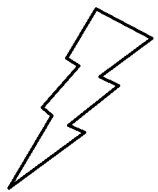
Figure 1:
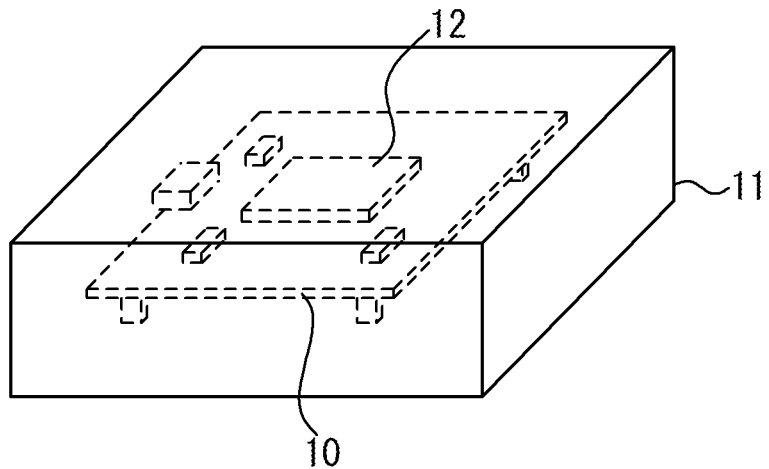

In one embodiment, as shown in FIG. 1, an electronic system 100 includes electronic equipment 10 and a casing 11 that accommodates the electronic equipment 10. The electronic equipment 10 includes an electronic device 12, such as an LSI and an electronic circuit. When external electromagnetic wave or radiation is incident on the electronic device 12, this may cause destruction (damage), failure or malfunction of the electronic device 12. Presented in embodiments described below are technologies to protect the electronic device 12 in the case when external electromagnetic wave or radiation with potential to cause destruction (damage), failure or malfunction of the electronic device 12 is incident on the electronic system 100.

Figure 2:
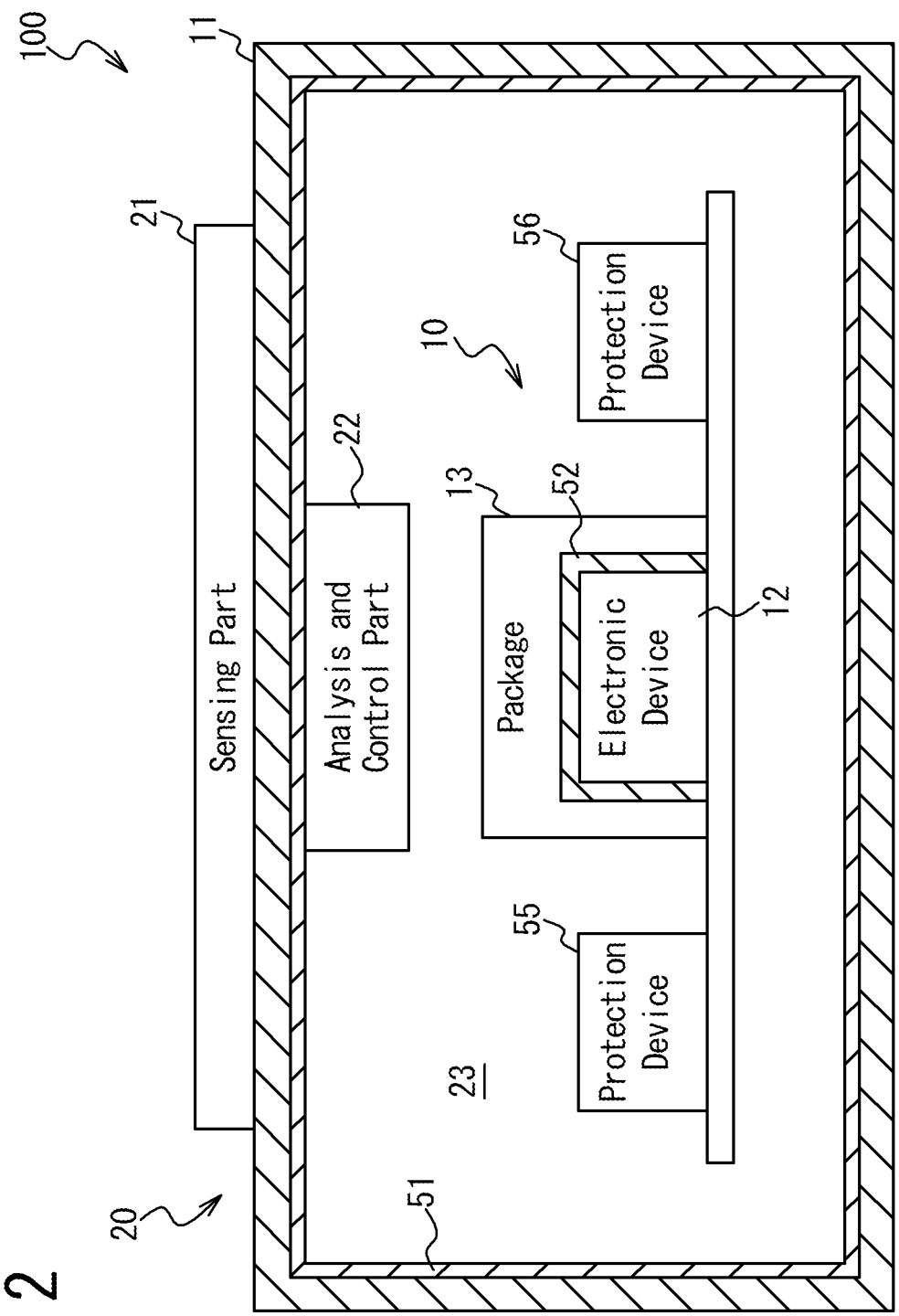
FIG. 2 is a partial section view showing the configuration of electronic device protection unit, according to one embodiment.

In one embodiment, as shown in FIG. 2, the electronic device 12 is accommodated in a package 13, and electronic device protection unit 20 that protects the electronic device 12 is further incorporated in the electronic system 100. The electronic device protection unit 20 includes a sensing part 21, an analysis and control part 22, and a responding part 23. The sensing part 21 detects incidence of an incident ray with potential to cause destruction (damage), failure, or malfunction of the electronic device 12. The incident ray may be non-ionizing radiation or ionizing radiation. In one embodiment, the non-ionizing radiation includes electromagnetic wave with a wavelength that does not cause ionization. In one embodiment, the ionizing radiation includes electromagnetic wave with a wavelength that causes ionization (e.g., an X-ray and a gamma ray) and a particle ray that causes ionization (e.g., a neutron ray, an alpha ray, and a beta ray). In one embodiment, the sensing part 21 is disposed external to the casing 11, but not limited to this.

The analysis and control part 22 controls the behaviors of the responding part 23 depending on the feature of the detected incident ray based on a sensing output received from the sensing part 21. In one embodiment, the analysis and control part 22 is disposed in the casing 11, but not limited to this.

The responding part 23 is configured to be able to perform various behaviors to protect the electronic device 12 under control of the analysis and control part 22. Reconfigurable electromagnetic shields 51, 52, and protection devices 55 and 56, both of which are included in the responding part 23, are shown in FIG. 2. It is noted that the responding part 23 may include other devices used to protect the electronic device 12 as described later.

Figure 3:
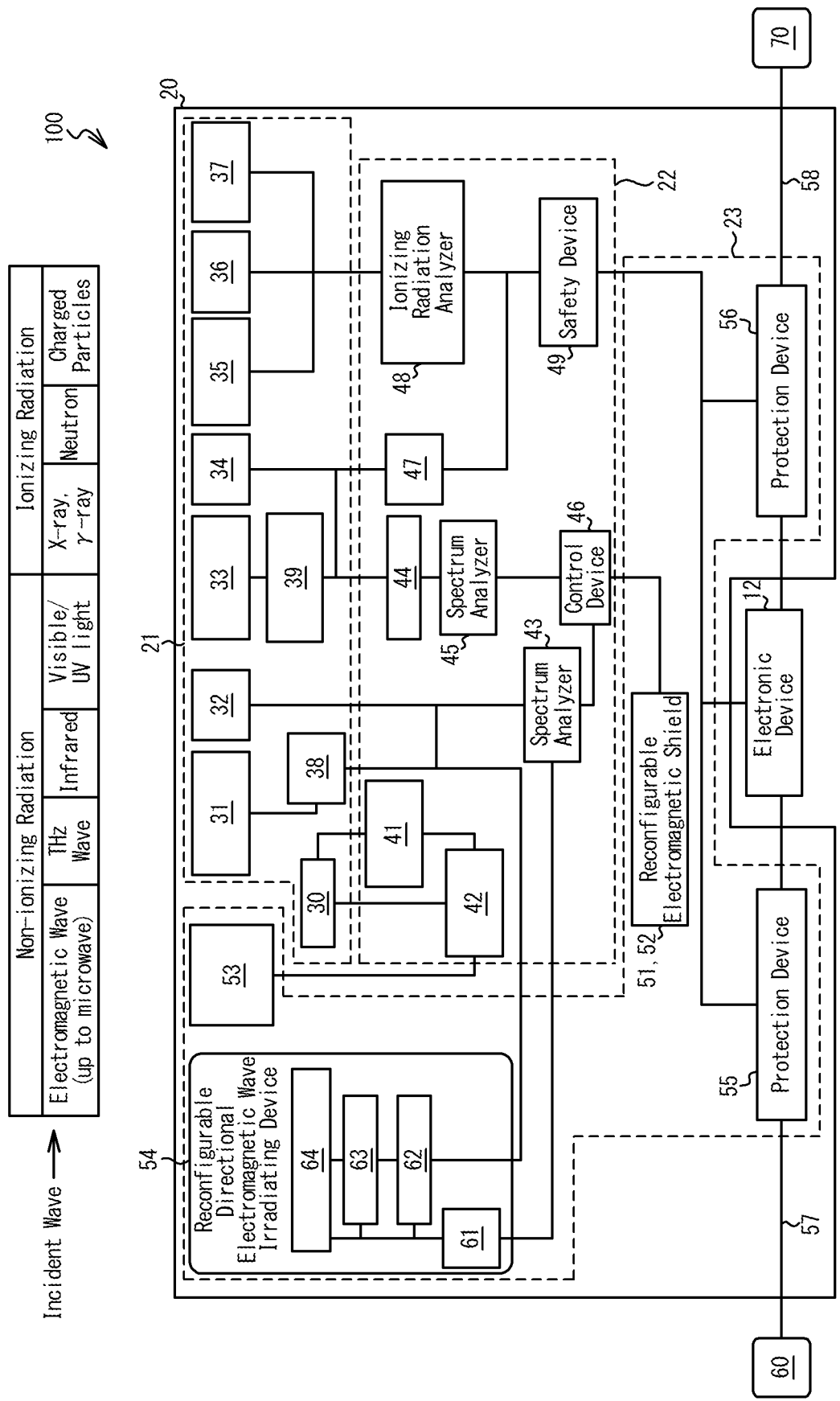
FIG. 3 is a block diagram showing the configuration of electronic device protection unit, according to one embodiment.

FIG. 3 is a block diagram showing the configuration of the electronic device protection unit 20 in one embodiment. The sensing part 21 includes a waveguide 30, an electromagnetic wave receiver 31, a terahertz wave sensor 32, a light receiver 33, an electric field sensor 34, an X-ray/γ-ray sensor 35, a neutron sensor 36, a charged particle sensor 37, a delivery device 38, and a light guide device 39. The analysis and control part 22 includes a phase control device 41, an incident wave control device 42, a spectrum analyzer 43, a spectroscope 44, a spectrum analyzer 45, a control device 46, a threshold circuit 47, an ionizing radiation analyzer 48, and a safety device 49. The responding part 23 includes reconfigurable electromagnetic shields 51, 52, an emission device 53, a reconfigurable directional electromagnetic wave irradiating device 54, and protection devices 55 and 56. The protection device 55 is inserted in a power line 57 that supplies a power supply voltage from a power supply unit 60 to the electronic device 12, and the protection device 56 is inserted in a communication line 58 connected between the electronic device 12 and external entity 70.

As shown in FIG. 2, the reconfigurable electromagnetic shield 51 of the responding part 23 is arranged to surround the electronic equipment 10. In the configuration shown in FIG. 2, the reconfigurable electromagnetic shield 51 is embedded in the casing 11, but not limited to this. The reconfigurable electromagnetic shield 52 is arranged to cover the electronic device 12. In the configuration shown in FIG. 2, the reconfigurable electromagnetic shield 52 is embedded in the package 13, but not limited to this.

In one embodiment, the reconfigurable electromagnetic shields 51 and 52 are comprised of reconfigurable electromagnetic meta-material. The electromagnetic meta-material used for the reconfigurable electromagnetic shields 51 and 52 is configured such that the electromagnetic properties thereof are reconfigurable. In one embodiment, the electromagnetic properties of the reconfigurable electromagnetic shields 51 and 52 are controlled by the control device 46.

Referring back to FIG. 3, the respective components of the sensing part 21 operate as follows. The waveguide 30, the electromagnetic wave receiver 31, the terahertz wave sensor 32, the light receiver 33, and the electric field sensor 34 operate as a non-ionizing radiation detector for detecting non-ionizing radiation with potential to cause destruction (damage), failure, or malfunction of the electronic device 12.

In detail, the waveguide 30 receives the externally incident electromagnetic wave and guides the incident electromagnetic wave to the analysis and control part 22. The electromagnetic wave receiver 31 receives externally incident microwaves and electromagnetic waves with longer wavelengths than those of microwaves and sends an electric signal, which has a waveform corresponding to those of the received electromagnetic waves via the delivery device 38, to the analysis and control part 22. The terahertz wave sensor 32 detects externally incident terahertz wave and generates an electric signal having a waveform corresponding to that of the received terahertz waves. The light receiver 33 receives light with wavelengths from infrared to ultraviolet on a light receiving surface and sends the received light to the analysis and control part 22 via the light guide device 39. An optical fiber or the like may be used as the light guide device 39. The electric field sensor 34 measures the strength of an electric field of an electromagnetic wave incident thereto.

The X-ray/γ-ray sensor 35, the neutron sensor 36, and charged particle sensor 37 operate as an ionizing radiation detector for detecting ionizing radiation with potential to cause destruction (damage), failure, or malfunction of the electronic device 12. In detail, the X-ray/γ-ray sensor 35 detects an X-ray and a γ-ray. The neutron sensor 36 detects a neutron ray. The charged particle sensor 37 detects a particle ray of charged particles, such as an alpha ray and a beta ray.

It is noted that the sensing part 21 may not necessarily include all of the waveguide 30, the electromagnetic wave receiver 31, the terahertz wave sensor 32, the light receiver 33, the electric field sensor 34, the X-ray/γ-ray sensor 35, the neutron sensor 36, and the charged particle sensor 37. The components disposed in the sensing part 21 may be selected depending on the environment in which the electronic system 100 is installed.

In one embodiment, the respective components of the analysis and control part 22 operate as follows. The phase control device 41 generates, from the electromagnetic wave received from the waveguide 30, electromagnetic wave with such a phase that the received electromagnetic wave is cancelled, for example, electromagnetic wave with the antiphase. The incident wave control device 42 is configured to cancel out the electromagnetic wave received from the waveguide 30 with the electromagnetic wave with the antiphase received from the phase control device 41. Additionally, the incident wave control device 42 is configured to provide the electromagnetic wave with the antiphase received from the phase control device 41 to the emission device 53 of the responding part 23. The spectrum analyzer 43 performs spectrum analysis for the electric signals received from the electromagnetic wave receiver 31 and the terahertz wave sensor 32. The spectroscope 44 spectrally disperses the light received from the light guide device 39. The spectrum analyzer 45 performs spectrum analysis based on the output of the spectroscope 44. The control device controls the electromagnetic properties of the reconfigurable electromagnetic shields 51 and 52 in response to the result of the spectrum analyses by the spectrum analyzers 43 and 45.

The threshold circuit 47 compares the intensity of the light received from the light guide device 39 with a given threshold value and compares the strength of the electric field measured by the electric field sensor 34 with a given threshold value, outputting an output indicative of the results of the comparisons to the safety device 49. The ionizing radiation analyzer 48 analyzes ionizing radiation incident on the electronic system 100 based on the outputs of the X-ray/γ-ray sensor 35, the neutron sensor 36, and the charged particle sensor 37. The safety device 49 controls the protection devices 55 and 56 of the responding part 23 based on the outputs of the threshold circuit 47 and the ionizing radiation analyzer 48. Additionally, the safety device 49 controls the operation of the electronic device 12 to be protected, based on the outputs of the threshold circuit 47 and the ionizing radiation analyzer 48. In one embodiment, based on the outputs of the threshold circuit 47 and the ionizing radiation analyzer 48, the safety device 49 stops the operation of the electronic device 12 to be protected or places the electronic device 12 into a safety securing mode.

In one embodiment, the respective components of the responding part 23 operate as follows. The reconfigurable electromagnetic shields 51 and 52 operate as electromagnetic shields that attenuates or shuts off the electromagnetic wave incident on the electronic system 100. The electromagnetic properties of the reconfigurable electromagnetic shields 51 and 52 are controlled by the control device 46 in response to the frequency of the incident electromagnetic wave. This allows efficiently attenuating or shutting off the electromagnetic wave.

The emission device 53 emits the electromagnetic wave received from the incident wave control device 42 outward from the electronic system 100. A waveguide tube, an antenna, or the like may be used as the emission device 53.

The reconfigurable directional electromagnetic wave irradiating device 54 is configured to emit electromagnetic wave in a desired direction outward from the electronic system 100, the electromagnetic wave being generated based on the electric signal received from the electromagnetic wave receiver via the delivery device 38. In one embodiment, the reconfigurable directional electromagnetic wave irradiating device 54 may emit canceling wave which is electromagnetic wave with such a phase that the external electromagnetic wave incident on the electronic system 100 is cancelled (e.g., the antiphase). Under a situation in which the external electromagnetic wave is intentionally irradiated to the electronic system 100, the reconfigurable directional electromagnetic wave irradiating device 54 may emit jamming electromagnetic wave based on the electric signal received from the electromagnetic wave receiver 31 toward an entity that emits the external electromagnetic wave.

In one embodiment, the reconfigurable directional electromagnetic wave irradiating device 54 includes a control device 61, a filter circuit 62, an amplifier circuit 63, and a reconfigurable antenna element 64. The control device 61 controls the properties of the filter circuit 62, the amplifier circuit 63, and the reconfigurable antenna element 64 according to the result of the spectrum analysis acquired by the spectrum analyzer 43. The filter circuit 62 extracts a desired frequency component of the electric signal received from the electromagnetic wave receiver 31 via the delivery device 38. The amplifier circuit 63 amplifies an electric signal output from the filter circuit 62. The reconfigurable antenna element 64 emits electromagnetic wave with a waveform corresponding to the waveform of an electric signal output from the amplifier circuit 63. The electromagnetic properties of the reconfigurable antenna element 64 are controllable by the control device 61; the phase and direction with which the electromagnetic wave is emitted from the reconfigurable antenna element 64 are controlled by the control device 61. The reconfigurable antenna element 64 may be comprised by using, for example, electromagnetic meta-material.

The protection device 55 performs a protection operation under control of the safety device 49 to prevent an undesired surge from intruding into the electronic device 12 via the power line 57, which supplies the power supply voltage to the electronic device 12. The protection device 55 may include a limiter circuit that limits the potential of the power line 57, a filter circuit that cuts off predetermined undesired frequency components, or a switch circuit that disconnects the electronic device 12 from the power supply unit 60.

On the other hand, the protection device 56 performs a protection operation under control of the safety device 49 to prevent an undesired surge from intruding into the electronic device 12 via the communication line 58. The protection device 56 may include a limiter circuit that limits the potential of the communication line 58 under the control of the safety device 49, a filter circuit that cuts off predetermined undesired frequency components, or a switch circuit that disconnects the electronic device 12 from the external entity 70.

It is noted that the sensing part 21 may not necessarily include all of the waveguide 30, the electromagnetic wave receiver 31, the terahertz wave sensor 32, the light receiver 33, the electric field sensor 34, the X-ray/γ-ray sensor 35, the neutron sensor 36, and the charged particle sensor 37. The components disposed in the sensing part 21 may be selected depending on the environment in which the electronic system 100 is installed. The responding part 23 may not necessarily include all of the reconfigurable electromagnetic shields 51, 52, the emission device 53, the reconfigurable directional electromagnetic wave irradiating device 54, and the protection devices 55 and 56. The components disposed in the responding part 23 may be selected depending on the environment in which the electronic system 100 is installed. In such embodiments, the configuration of the analysis and control part 22 is selected in accordance with the components disposed in the sensing part 21 and the responding part 23.

The operation of the electronic device protection unit 20 in the case when non-ionizing radiation (such as electromagnetic wave) or ionizing radiation is incident on the electronic system 100 is described in the following.

Figure 4:
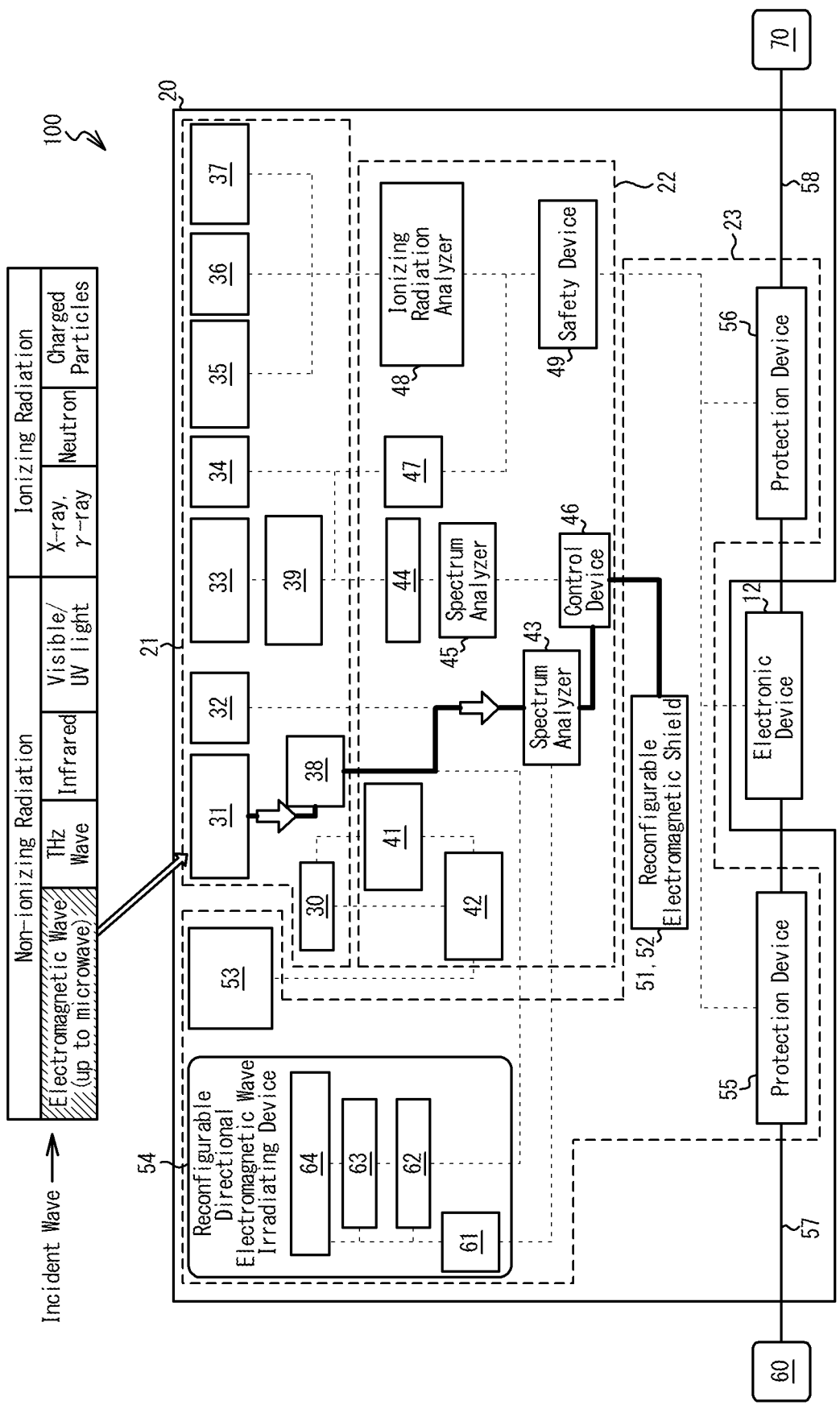
FIG. 4 is a block diagram showing the operation of electronic device protection unit, according to one embodiment.

In one embodiment, when external electromagnetic wave with a microwave frequency or a frequency lower than the microwave frequency is incident as shown in FIG. 4, the electronic device 12 is protected from the external electromagnetic wave by controlling the electromagnetic properties of the reconfigurable electromagnetic shields 51, of the responding part 23. In detail, the external electromagnetic wave is received by the electromagnetic wave receiver 31 of the sensing part 21, and an electric signal with a waveform corresponding to the external electromagnetic wave is provided from the electromagnetic wave receiver 31 to the spectrum analyzer 43 of the analysis and control part 22 via the delivery device 38. The spectrum analyzer 43 performs spectrum analysis of the external electromagnetic wave based on the electric signal received from the electromagnetic wave receiver 31. The control device 46 receives the result of the spectrum analysis from the spectrum analyzer 43 and controls the electromagnetic properties of the reconfigurable electromagnetic shields 51 and 52 in response to the result of the spectrum analysis such that the incident electromagnetic wave is sufficiently attenuated, or ideally cut off. This reduces the external electromagnetic wave incident on the electronic device 12 or prevents the external electromagnetic wave from entering the electronic device 12.

Figure 5:
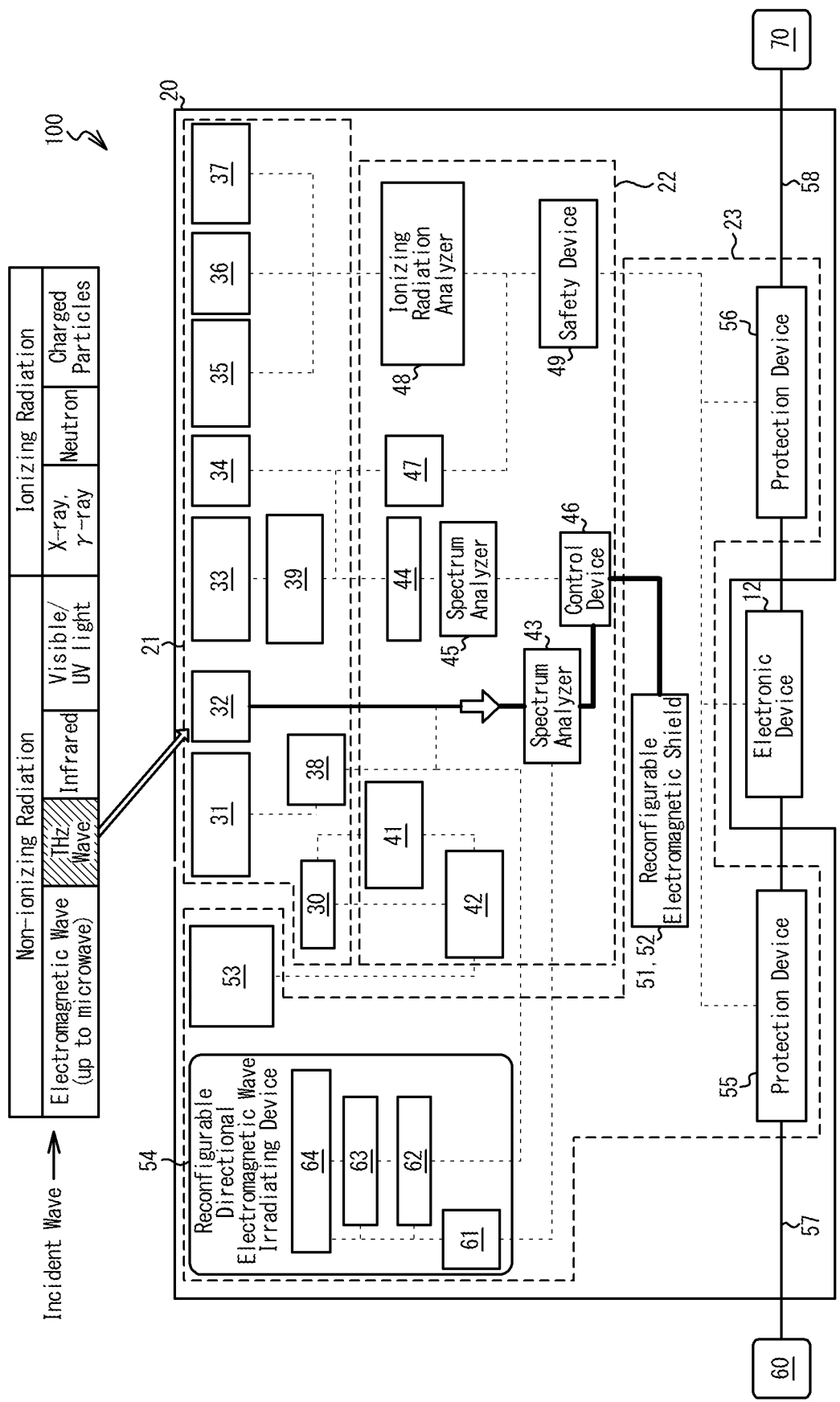
FIG. 5 is a block diagram showing the operation of electronic device protection unit, according to one embodiment.

In one embodiment, when terahertz wave as the external electromagnetic wave is incident as shown in FIG. 5, the electronic device 12 is protected from the terahertz wave by controlling the electromagnetic properties of the reconfigurable electromagnetic shields 51, 52 of the responding part 23. In detail, the terahertz wave is received by the terahertz wave sensor 32 of the sensing part 21, and an electric signal with a waveform corresponding to the terahertz wave is provided to the spectrum analyzer 43 of the analysis and control part 22 from the terahertz wave sensor 32. The spectrum analyzer 43 performs spectrum analysis of the incident terahertz wave based on the electric signal received from the terahertz wave sensor 32. The control device 46 receives the result of the spectrum analysis from the spectrum analyzer 43 and controls the electromagnetic properties of the reconfigurable electromagnetic shields 51 and 52 in response to the result of the spectrum analysis such that the external electromagnetic wave is sufficiently attenuated, or ideally shut off. This reduces the terahertz wave incident on the electronic device 12 or prevents the terahertz wave from entering the electronic device 12.

Figure 6:
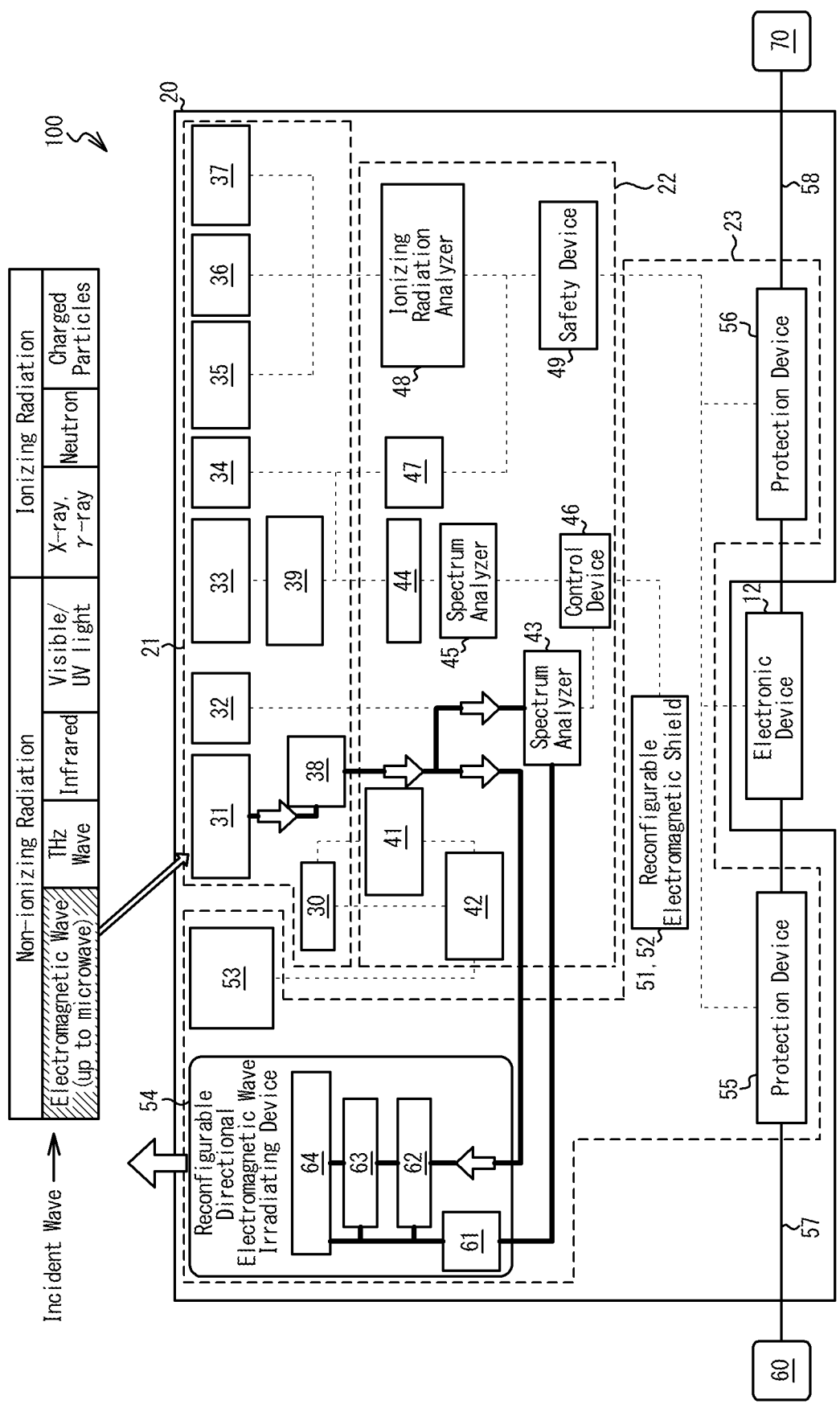
FIG. 6 is a block diagram showing the operation of electronic device protection unit, according to one embodiment.

In one embodiment, when external electromagnetic wave with a microwave frequency or a frequency lower than the microwave frequency is incident as shown in FIG. 6, the electronic device 12 is protected from the external electromagnetic wave by emitting canceling wave which is electromagnetic wave with such a phase that the external electromagnetic wave is cancelled (e.g., the antiphase) from the reconfigurable directional electromagnetic wave irradiating device 54. In detail, the external electromagnetic wave is received by the electromagnetic wave receiver 31 of the sensing part 21, and an electric signal with a waveform corresponding to the external electromagnetic wave is supplied from the electromagnetic wave receiver 31 to the spectrum analyzer 43 of the analysis and control part 22 via the delivery device 38. The spectrum analyzer 43 performs spectrum analysis of the external electromagnetic wave based on the electric signal received from the electromagnetic wave receiver 31. The electric signal from the electromagnetic wave receiver 31 is also provided to the reconfigurable directional electromagnetic wave irradiating device 54 via the delivery device 38. The reconfigurable directional electromagnetic wave irradiating device 54 generates the canceling wave based on the electric signal received from the electromagnetic wave receiver 31 and the result of the spectrum analysis by the spectrum analyzer 43 and emits the generated canceling wave. The emission of the canceling wave achieves canceling of the external electromagnetic wave, protecting the electronic device 12 from the external electromagnetic wave.

In one embodiment, the generation of the canceling wave by the reconfigurable directional electromagnetic wave irradiating device 54 is achieved as follows. The electric signal from the electromagnetic wave receiver 31 is input to the filter circuit 62, and the electric signal output from the filter circuit 62 is amplified by the amplifier circuit 63. The properties of the filter circuit 62 and the amplifier circuit 63 are controlled by the control device 61 according to the result of the spectrum analysis acquired by the spectrum analyzer 43. The electric signal output from the amplifier circuit 63 is provided to the reconfigurable antenna element 64 and used to emit the canceling wave. The phase and direction of the emitted canceling wave are controlled by adjusting the electromagnetic properties of the reconfigurable antenna element 64 with the control device 61. The electromagnetic properties of the reconfigurable antenna element 64 may be controlled according to the result of the spectrum analysis acquired by the spectrum analyzer 43.

In one embodiment, the reconfigurable directional electromagnetic wave irradiating device 54 may emit jamming electromagnetic wave toward an entity that emits the external electromagnetic wave based on the electric signal received from the electromagnetic wave receiver 31 and/or the result of the spectrum analysis. The emitting direction of the jamming electromagnetic wave is controlled by adjusting the electromagnetic properties of the reconfigurable antenna element 64 with the control device 61.

Figure 7:
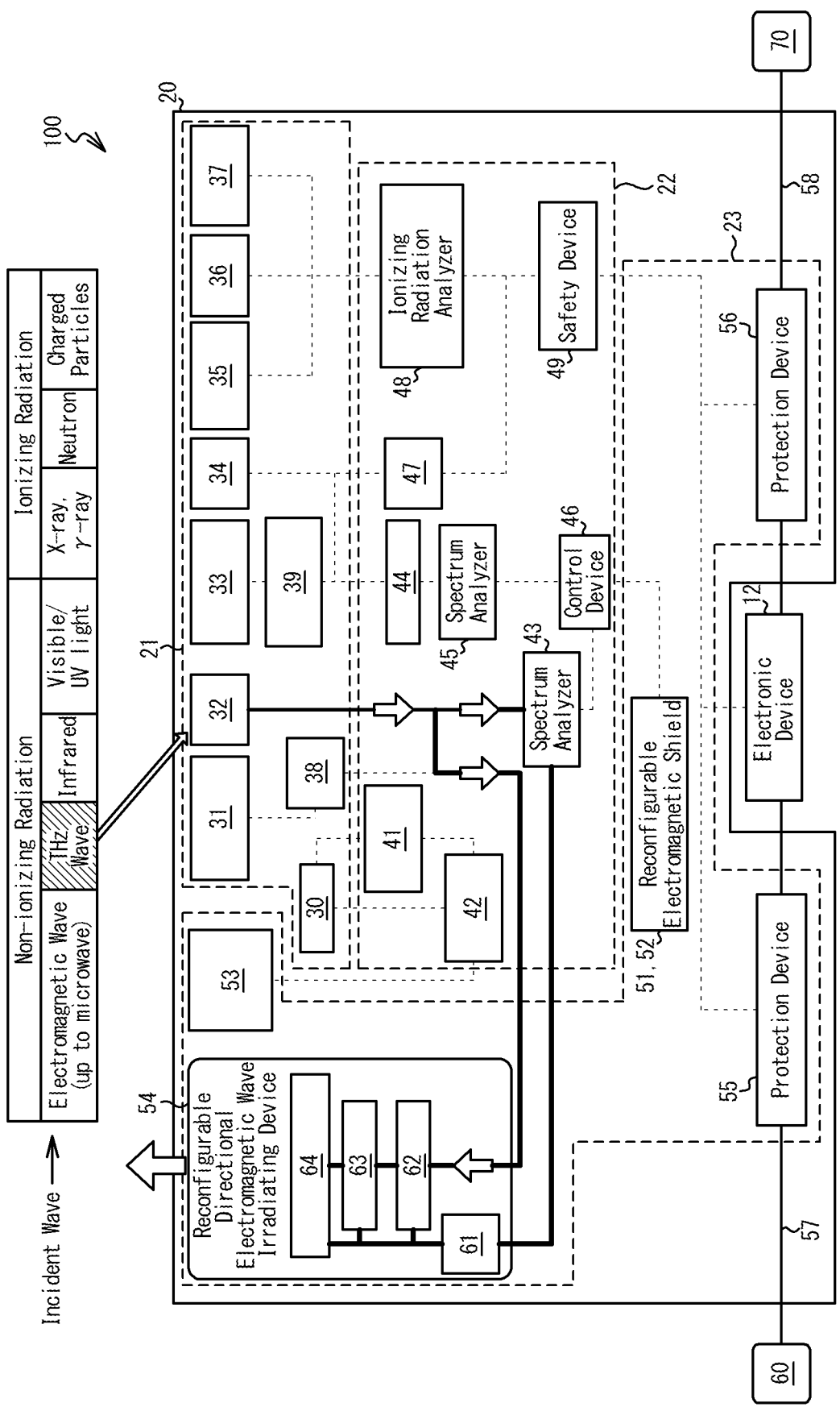
FIG. 7 is a block diagram showing the operation of electronic device protection unit, according to one embodiment.

In one embodiment, when terahertz wave as the external electromagnetic wave is incident as shown in FIG. 7, the electronic device 12 is protected from the terahertz wave by emitting canceling wave from the reconfigurable directional electromagnetic wave irradiating device 54, where the canceling wave is electromagnetic wave with such a phase that the terahertz wave is cancelled (e.g., the antiphase). In detail, the terahertz wave is received by the terahertz wave sensor 32 of the sensing part 21, and an electric signal with a waveform corresponding to the terahertz wave is supplied from the terahertz wave sensor 32 to the spectrum analyzer 43 of the analysis and control part 22. The spectrum analyzer 43 performs spectrum analysis of the incident terahertz wave based on the electric signal received from the terahertz wave sensor 32. The electric signal from the terahertz wave sensor 32 is also provided to the reconfigurable directional electromagnetic wave irradiating device 54. The reconfigurable directional electromagnetic wave irradiating device 54 generates the canceling wave based on the electric signal from the terahertz wave sensor 32 and the result of the spectrum analysis by the spectrum analyzer 43 and emits the generated canceling wave. The operation of the reconfigurable directional electromagnetic wave irradiating device 54 for the case when the terahertz wave is incident is similar to the case that the external electromagnetic wave with a microwave frequency or a frequency lower than the microwave frequency is incident, except for the case that the electric signal is received from the terahertz wave sensor 32 in place of the electromagnetic wave receiver 31.

In one embodiment, based on the electric signal received from the terahertz wave sensor 32 and/or the result of the spectrum analysis, the reconfigurable directional electromagnetic wave irradiating device 54 may emit jamming electromagnetic wave toward an entity that emits the terahertz wave. The emitting direction of the jamming electromagnetic wave is emitted is controlled by adjusting the electromagnetic properties of the reconfigurable antenna element 64 with the control device 61.

Both the above-described protection by the reconfigurable electromagnetic shields 51 and 52 and the above-described protection through the emission of the canceling wave may be used at the same time. The protection by the reconfigurable electromagnetic shields 51 and 52 and the protection through the emission of the canceling wave may be selectively implemented according to the result of the spectrum analysis acquired by the spectrum analyzer 43.

Figure 8:
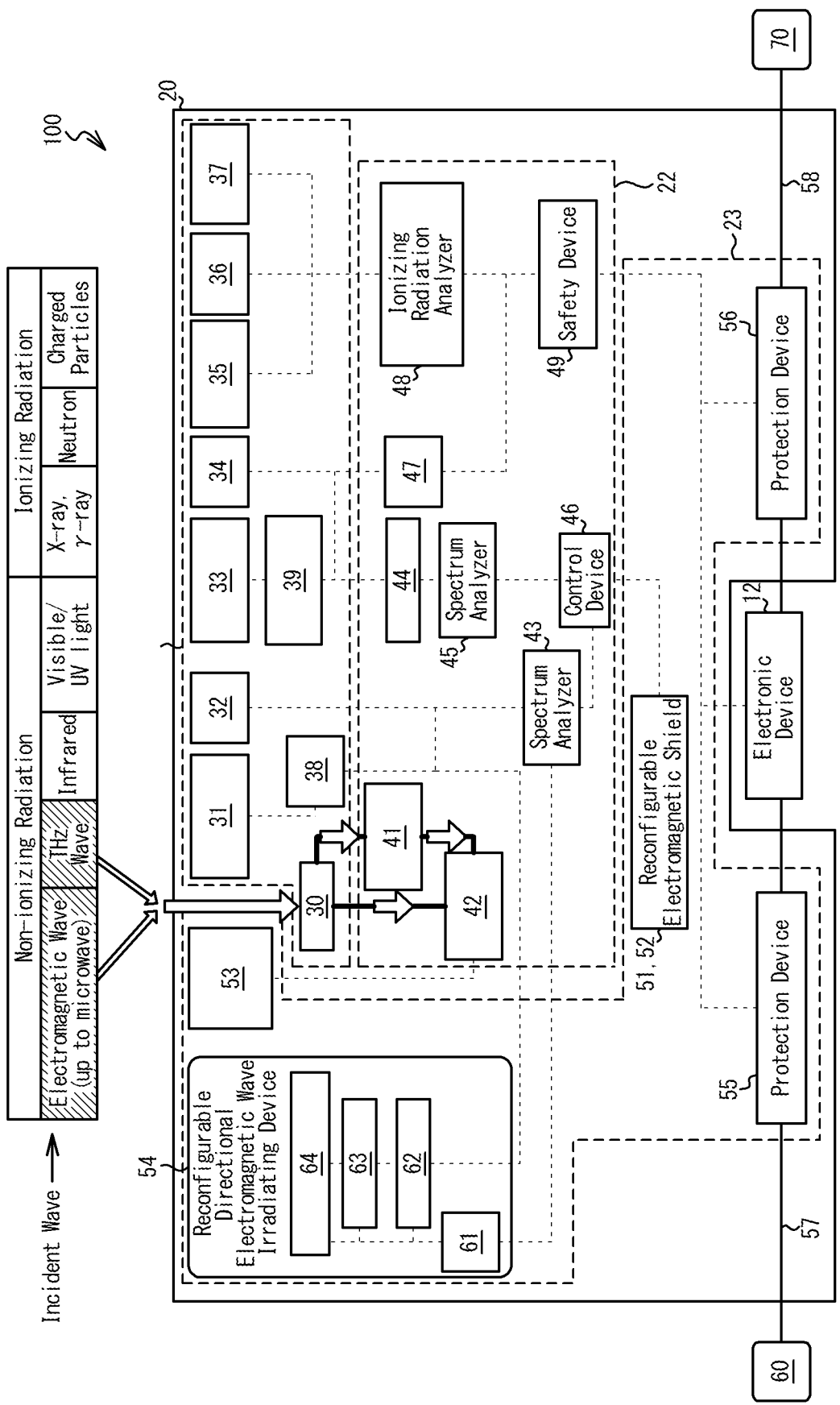
FIG. 8 is a block diagram showing the operation of electronic device protection unit, according to one embodiment.

In one embodiment, as shown in FIG. 8, the electronic device 12 is protected from external electromagnetic wave by canceling the external electromagnetic wave by using the phase control device 41 and the incident wave control device 42 of the analysis and control part 22. When receiving external electromagnetic wave to be cancelled, the waveguide 30 guides the received external electromagnetic wave to the phase control device 41 and the incident wave control device 42. The external electromagnetic wave to be cancelled may be microwave or electromagnetic wave with a frequency lower than the microwave frequency. Alternatively, the external electromagnetic wave to be cancelled may be terahertz wave. The phase control device 41 generates electromagnetic wave with the antiphase to that of the external electromagnetic wave by controlling the phase of the electromagnetic wave received from the waveguide 30. The incident wave control device 42 superposes the external electromagnetic wave received from the waveguide 30 and the electromagnetic wave received from the phase control device 41, and thereby cancels out the electromagnetic wave received from the waveguide 30. When performing this operation, this implies that the phase control device 41 and the incident wave control device 42 also function as the responding part 23.

Figure 9:
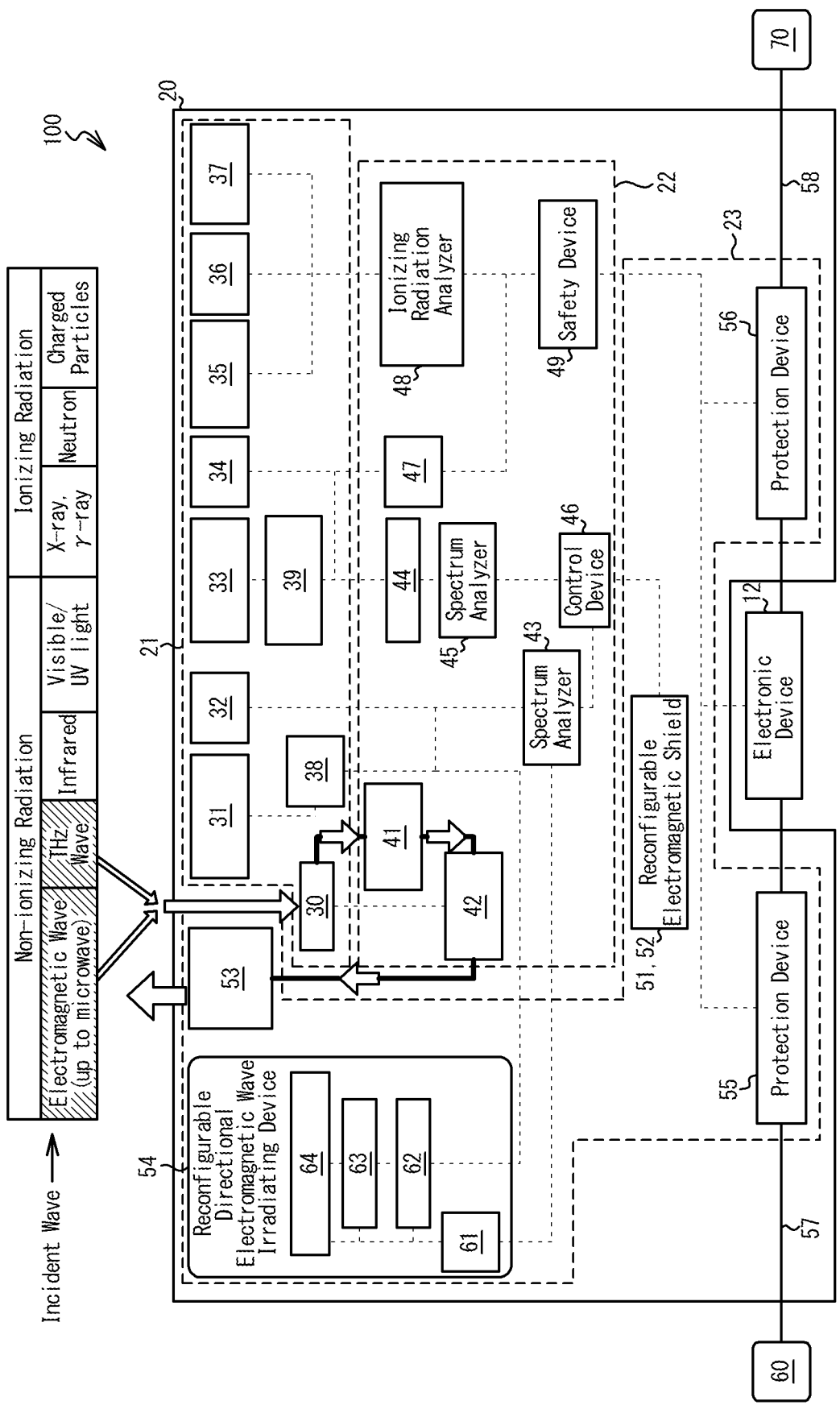
FIG. 9 is a block diagram showing the operation of electronic device protection unit, according to one embodiment.

In one embodiment, as shown in FIG. 9, the electronic device 12 is protected from external electromagnetic wave by generating canceling wave based on the external electromagnetic wave received by the waveguide 30 of the sensing part 21 and emitting the generated canceling wave from the emission device 53. In detail, when receiving the external electromagnetic wave to be canceled, the waveguide 30 guides the received external electromagnetic wave to the phase control device 41 of the analysis and control part 22. The phase control device 41 generates electromagnetic wave with an antiphase to that of the external electromagnetic wave by controlling the phase of the electromagnetic wave received from the waveguide 30. The generated electromagnetic wave with the antiphase is provided to the emission device 53 via the incident wave control device 42. The emission device 53 generates the canceling wave based on the electromagnetic wave with the antiphase received from the phase control device 41 and emits the generated canceling wave. The canceling wave has such a phase that the incident electromagnetic wave is cancelled, for example, the antiphase. The emission of the canceling wave achieves canceling of the external electromagnetic wave, protecting the electronic device 12 from the external electromagnetic wave.

In one embodiment, the emission device 53 may emit jamming electromagnetic wave generated based on the external electromagnetic wave received by the waveguide 30 toward an entity that emits the external electromagnetic wave. In this case, the jamming electromagnetic wave is generated in the same manner as the canceling wave.

Figure 10:
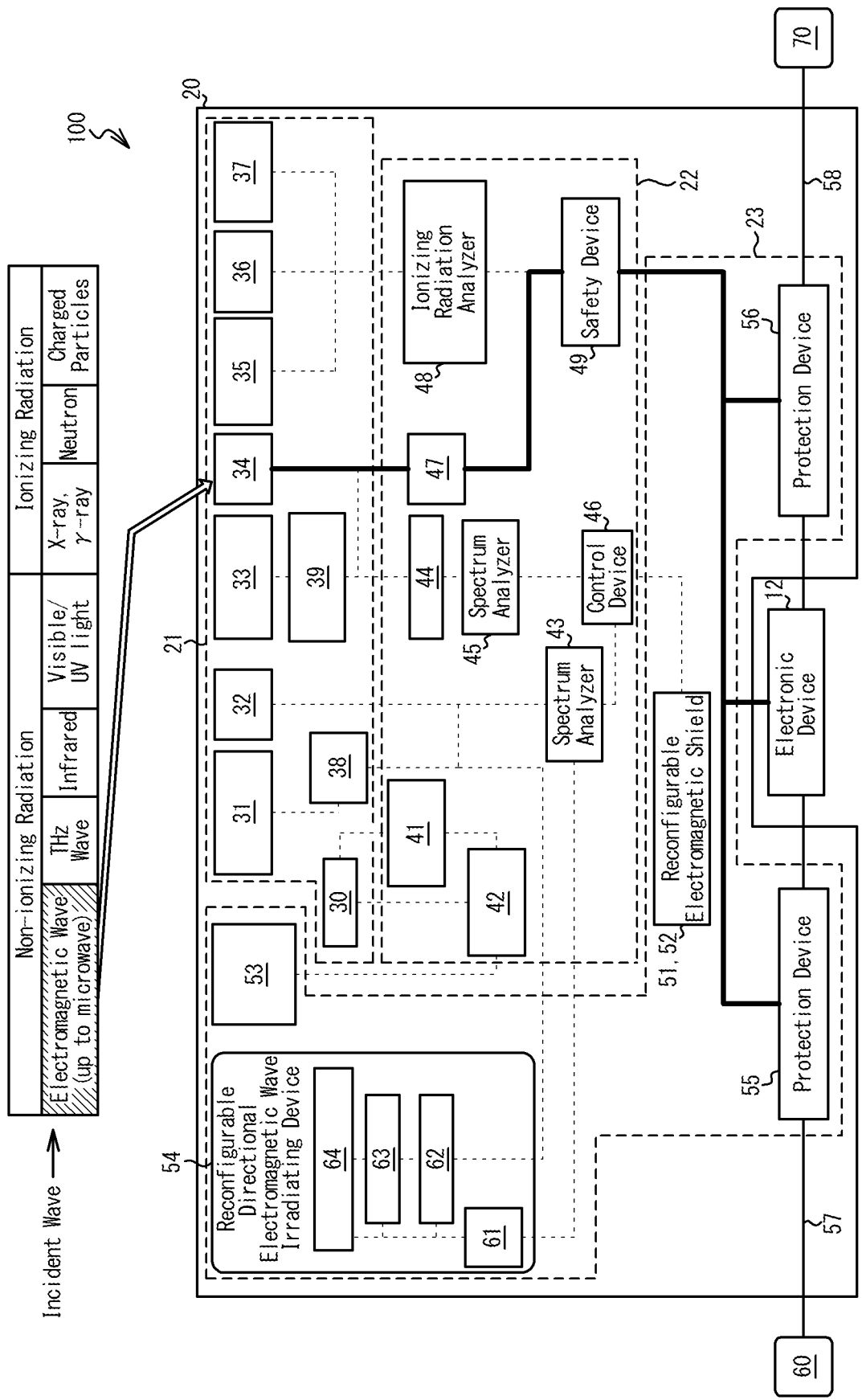
FIG. 10 is a block diagram showing the operation of electronic device protection unit, according to one embodiment.

In one embodiment, as shown in FIG. 10, an operation to protect the electronic device 12 is implemented based on the electric field strength measured by the electric field sensor 34 of the sensing part 21. The threshold circuit 47 of the analysis and control part 22 compares the electric field strength measured by the electric field sensor 34 with a given threshold value and provides an output indicative of the comparison result to the safety device 49. Based on the output of the threshold circuit 47, the safety device 49 operates the protection devices 55 and 56 and/or controls the operation of the electronic device 12. In one embodiment, when the electric field strength measured by the electric field sensor 34 exceeds the given threshold value, the protection devices 55 and/or 56 perform a protection operation under control of the safety device 49 to prevent a surge from intruding into the electronic device 12 via the power line 57 and/or the communication line 58.

In embodiments where the protection devices 55 and/or 56 includes a limiter circuit, the protection devices 55 and/or 56 may limit the potentials of the power line 57 and/or the communication line 58 by operating the limiter circuit when the measured electric field strength exceeds the given threshold value. In embodiments where the protection devices 55 and/or 56 includes a filter circuit, the protection devices 55 and/or 56 may operate the filter circuit to cut off predetermined undesired frequency components when the measured electric field strength exceeds the given threshold value. In embodiments where the protection devices 55 and/or 56 includes a switch circuit, the protection devices 55 and/or 56 may operate the switch circuit to disconnect the power supply unit 60 and/or the external entity 70 from the electronic device 12 when the measured electric field strength exceeds the given threshold value.

In addition to, or in place of the activations of the protection devices 55 and/or 56, the safety device 49 may temporarily stop the operation of the electronic device 12 when the electric field strength measured by the electric field sensor 34 exceeds the given threshold value. This effectively prevents a failure of the electronic device 12. The electronic device 12 may be set to a safety securing mode instead of temporarily stopping the operation of the electronic device 12.

This operation is effective for protection of the electronic device 12 in the case when external electromagnetic wave with a relatively low frequency is incident.

Figure 11:
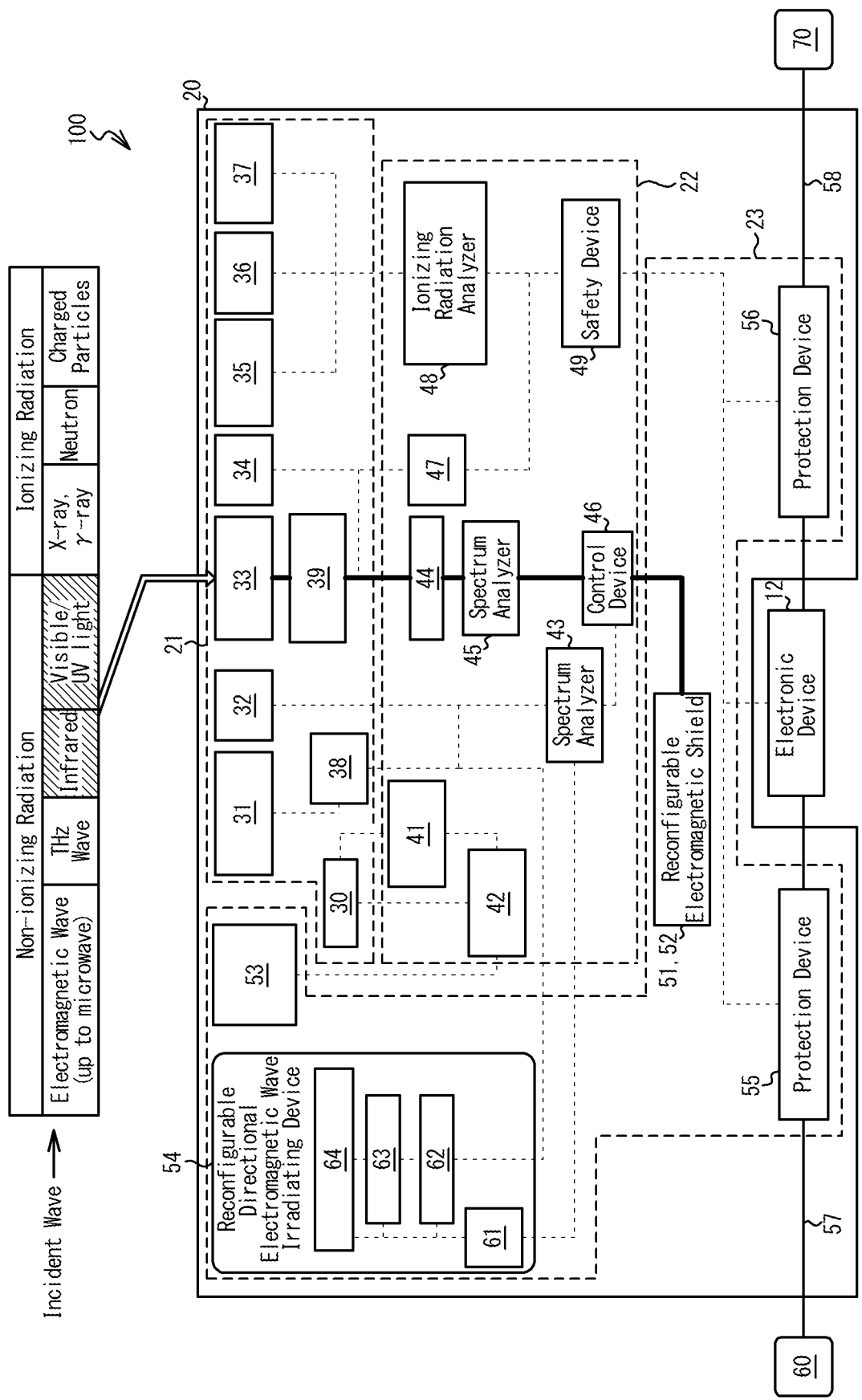
FIG. 11 is a block diagram showing the operation of electronic device protection unit, according to one embodiment.

In one embodiment, when light with a wavelength from infrared to ultraviolet is incident as shown in FIG. 11, the electronic device 12 is protected from the incident light by controlling the electromagnetic properties of the reconfigurable electromagnetic shields 51 and 52 of the responding part 23. When light with a wavelength from infrared to ultraviolet is incident on the light receiving surface of the light receiver 33, the incident light is introduced into the spectroscope 44 of the analysis and control part 22 via the light guide device 39. The spectroscope 44 spectrally disperses the light received from the light guide device 39. The spectrum analyzer 45 performs spectrum analysis based on the output of the spectroscope 44. The control device 46 controls the electromagnetic properties of the reconfigurable electromagnetic shields 51 and 52 in response to the result of the spectrum analysis by the spectrum analyzer 45. This reduces the intensity of light incident on the electronic device 12 or prevents the light from entering the electronic device 12.

Figure 12:
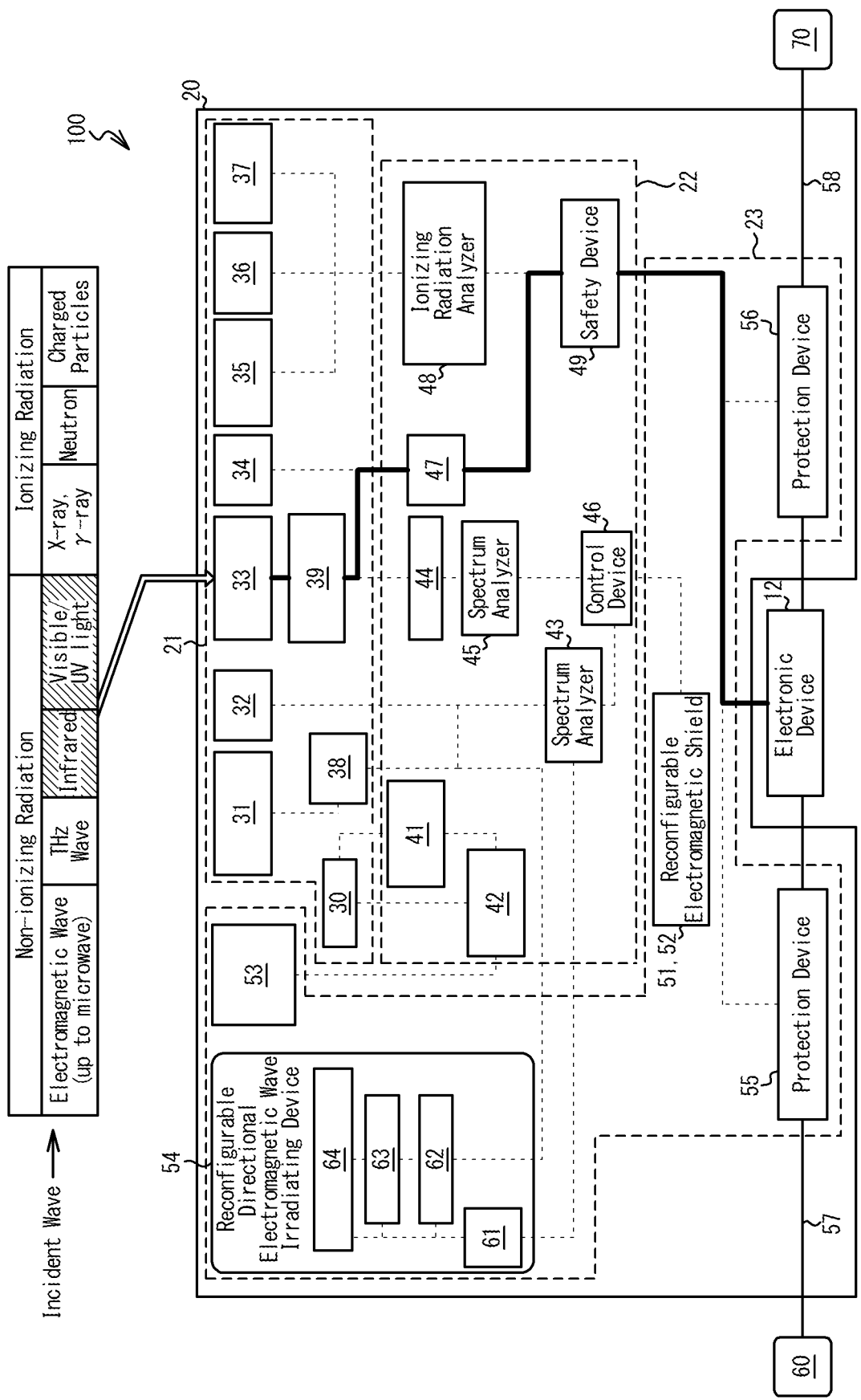
FIG. 12 is a block diagram showing the operation of electronic device protection unit, according to one embodiment.

In one embodiment, when light with a wavelength from infrared to ultraviolet is incident as shown in FIG. 12, an operation to protect the electronic device 12 is implemented in response to the intensity of the incident light. When the light with the wavelength from infrared to ultraviolet is incident on the light receiving surface of the light receiver 33, the incident light is introduced into the threshold circuit of the analysis and control part 22 via the light guide device 39. The threshold circuit 47 compares the intensity of the incident light with a given threshold value and provides an output indicative of the comparison result to the safety device 49. The safety device 49 controls the operation of the electronic device 12 based on the output of the threshold circuit 47. In one embodiment, the safety device 49 may temporarily stop the operation of the electronic device 12 when the intensity of the incident light exceeds the given threshold value. The electronic device 12 may be set to a safety securing mode in place of temporarily stopping the operation of the electronic device 12.

Figure 13:
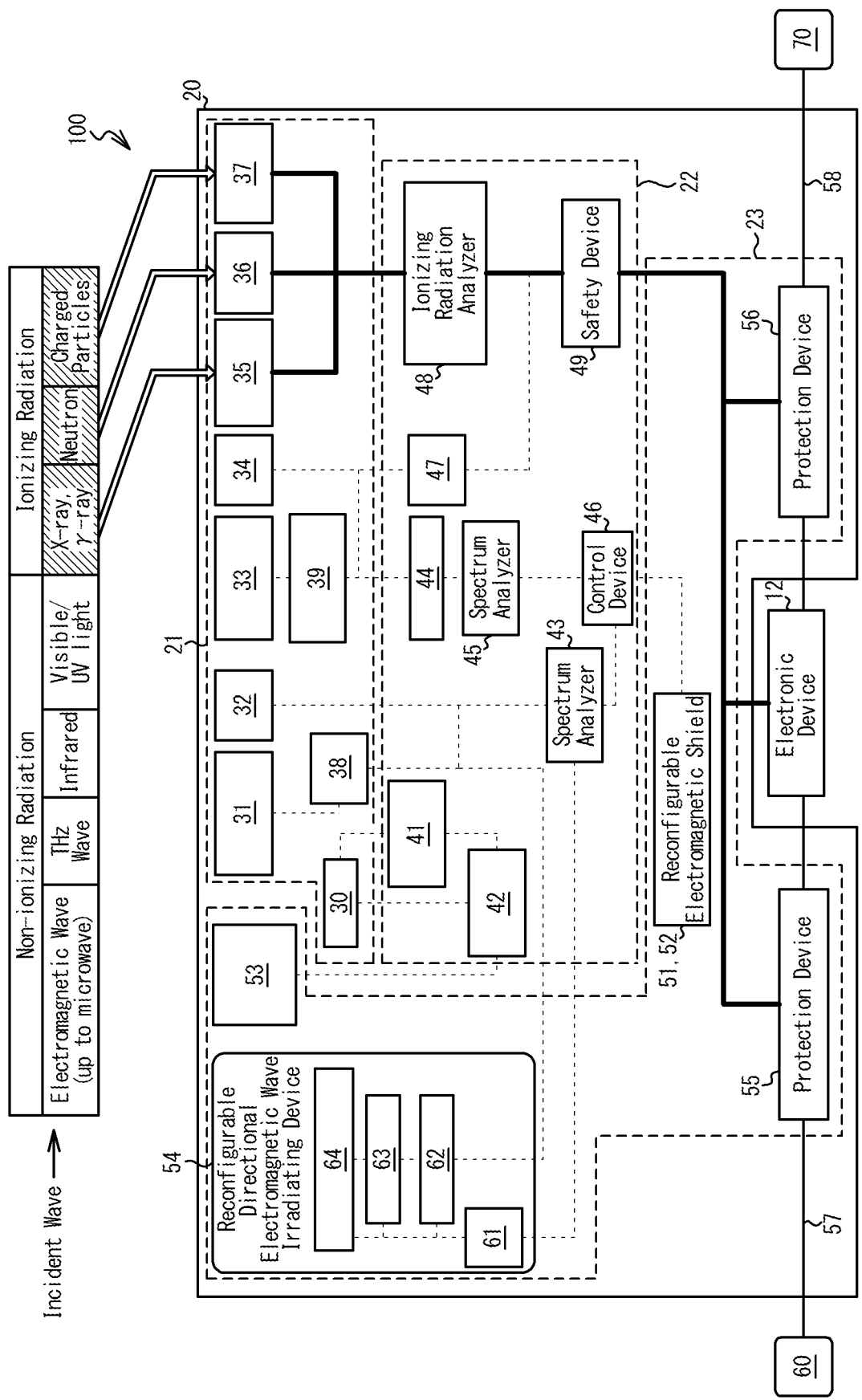
FIG. 13 is a block diagram showing the operation of electronic device protection unit, according to one embodiment.

In one embodiment, when ionization radiation is incident as shown in FIG. 13, an operation to protect the electronic device 12 is implemented in response to the intensity of the incident ionizing radiation. The X-ray/γ-ray sensor 35, the neutron sensor 36, and the charged particle sensor 37 operate as an ionizing radiation detector that detects the ionizing radiation. As described above, in one embodiment, the detected ionization radiation includes electromagnetic wave with wavelengths that cause ionization (e.g., an X-ray and a gamma ray) and a particle ray that causes ionization (e.g., a neutron ray, an alpha ray, and a beta ray). The ionizing radiation analyzer 48 analyzes the incident ionizing radiation based on the outputs of the X-ray/γ-ray sensor 35, the neutron sensor 36, and the charged particle sensor 37. Based on the analysis result of the ionizing radiation, the safety device 49 operates the protection devices 55 and 56 and/or controls the operation of the electronic device 12. In one embodiment, the protection devices 55 and/or 56 performs a protection operation under control of the safety device 49 to prevent a surge from intruding into the electronic device 12 via the power line 57 and/or the communication line 58 when the intensity of the detected ionizing radiation exceeds the given threshold value.

In embodiments where the protection devices 55 and/or 56 includes a limiter circuit, the protection devices 55 and/or 56 may limit the potentials of the power line 57 and/or the communication line 58 by operating the limiter circuit when the intensity of the detected ionizing radiation exceeds the given threshold value. In embodiments where the protection devices 55 and/or 56 includes a filter circuit, the protection devices and/or 56 may operate the filter circuit to cut off predetermined undesired frequency components when the intensity of the detected ionizing radiation exceeds the given threshold value. In embodiments where the protection devices 55 and/or 56 includes a switch circuit, the protection devices 55 and/or 56 may operate the switch circuit to disconnect the power supply unit 60 and/or the external entity 70 from the electronic device 12 when the intensity of the detected ionizing radiation exceeds the given threshold value.

In addition to, or in place of the activations of the protection devices 55 and/or 56, the safety device 49 may temporarily stop the operation of the electronic device 12 when the intensity of the detected ionizing radiation exceeds the given threshold. The electronic device 12 may be set to a safety securing mode instead of temporarily stopping the operation of the electronic device 12.

Although embodiments have been specifically described in the above, the present invention is not limited to the above-described embodiments. Those skilled in the art would appreciate that the present invention may be implemented with various modifications.

The present application claims priority on Japanese patent application No. 2019-031691, filed on Feb. 25, 2019, the disclosure of which is incorporated herein by reference in its entirety.

The invention claimed is:

1. An electronic device protection unit, comprising:
a sensing part comprising an ionizing radiation detector configured to detect ionizing radiation with potential to cause destruction, failure, or malfunction of an electronic device;
a responding part configured to be able to perform a plurality of behaviors to protect the electronic device; and
an analysis and control part configured to analyze the ionizing radiation based on an output of the ionizing radiation detector and control the behaviors of the responding part based on a result of the analysis of the ionizing radiation.

2. The electronic device protection unit according to claim 1, wherein the sensing part is configured to detect electromagnetic wave with potential to cause destruction, failure, or malfunction of the electronic device,
wherein the responding part comprises a reconfigurable electromagnetic shield comprised of electromagnetic meta-material,
wherein the analysis and control part is configured to perform spectrum analysis of external electromagnetic wave incident on the sensing part and to control an electromagnetic property of the reconfigurable electromagnetic shield according to a result of the spectrum analysis.

3. The electronic device protection unit according to claim 2, wherein the reconfigurable electromagnetic shield is embedded in a casing that accommodates an electronic equipment equipped with the electronic device.

4. The electronic device protection unit according to claim 2, wherein the reconfigurable electromagnetic shield is embedded in a package that accommodates the electronic device to cover the electronic device.

5. The electronic device protection unit according to claim 1, wherein the sensing part is configured to detect electromagnetic wave with potential to cause destruction, failure, or malfunction of the electronic device,
wherein the analysis and control part is configured to perform spectrum analysis of external electromagnetic wave incident on the sensing part, and
wherein the responding part is configured to emit canceling wave that cancels out the external electromagnetic wave according to a result of the spectrum analysis.

6. The electronic device protection unit according to claim 1, wherein the sensing part is configured to detect electromagnetic wave with potential to cause destruction, failure, or malfunction of the electronic device,
wherein the analysis and control part is configured to perform spectrum analysis of external electromagnetic wave incident on the sensing part, and
wherein the responding part is configured to emit jamming electromagnetic wave toward an entity that emits the external electromagnetic wave according to a result of the spectrum analysis.

7. The electronic device protection unit according to claim 1, wherein the sensing part is configured to detect electromagnetic wave with potential to cause destruction, failure, or malfunction of the electronic device,
wherein the sensing part comprises a waveguide configured to receive external electromagnetic wave and guide the received external electromagnetic wave,
wherein the analysis and control part is configured to generate electromagnetic wave with an antiphase to that of the external electromagnetic wave by controlling a phase of the electromagnetic wave received from the waveguide, and
wherein the electromagnetic wave received from the waveguide and the electromagnetic wave with the antiphase are cancelled through superposition.

8. The electronic device protection unit according to claim 1, wherein the sensing part is configured to detect electromagnetic wave with potential to cause destruction, failure, or malfunction of the electronic device,
wherein the sensing part comprises a waveguide configured to receive external electromagnetic wave and guide the received external electromagnetic wave,
wherein the analysis and control part is configured to generate electromagnetic wave with an antiphase to that of the external electromagnetic wave by controlling a phase of the electromagnetic wave received from the waveguide, and
wherein the responding part is configured to emit cancelling wave based on the electromagnetic wave with the antiphase.

9. The electronic device protection unit according to claim 1, wherein the sensing part comprises an electric field sensor,
wherein the responding part comprises a first protection device implemented in a power line that supplies a power supply voltage from a power supply unit to the electric device and configured to perform a protection operation in order to prevent a surge from intruding into the electronic device via the power line, and
wherein the analysis and control part is configured to control the first protection device depending on an electric field strength measured by the electric field sensor.

10. The electronic device protection unit according to claim 1, wherein the sensing part comprises an electric field sensor,
wherein the responding part comprises a second protection device implemented in a communication line connected between the electronic device and an external entity and configured to perform a protection operation in order to prevent a surge from intruding into the electronic device via the communication line, wherein the analysis and control part is configured to control the second protection device based on an electric field strength measured by the electric field sensor.

11. The electronic device protection unit according to claim 1, wherein the sensing part includes an electric field sensor, and wherein the analysis and control part is configured to control an operation of the electronic device depending on an electric field strength measured by the electric field sensor.

12. The electronic device protection unit according to claim 1, wherein the sensing part comprises a light receiver that receives light with a wavelength from infrared to ultraviolet, wherein the responding part comprises a reconfigurable electromagnetic shield comprised of electromagnetic meta-material, and wherein the analysis and control part is configured to perform spectrum analysis of the light incident on the light receiver and control an electromagnetic property of the reconfigurable electromagnetic shield according to a result of the spectrum analysis.

13. The electronic device protection unit according to claim 1, wherein the sensing part comprises a light receiver that receives light with a wavelength from infrared to ultraviolet, and wherein the analysis and control part is configured to control an operation of the electronic device based on an intensity of the light incident on the light receiver.

14. The electronic device protection unit according to claim 1, wherein the responding part comprises a first protection device implemented in a power line that supplies a power supply voltage from a power supply unit to the electric device and configured to perform a protection operation in order to prevent a surge from intruding into the electronic device via the power line, and wherein the analysis and control part is configured to control the first protection device based on the result of the analysis of the ionizing radiation.

15. The electronic device protection unit according to claim 1, wherein the responding part comprises a second protection device implemented in a communication line connected between the electronic device and an external entity and configured to perform a protection operation in order to prevent a surge from intruding into the electronic device via the communication line, and wherein the analysis and control part is configured to control the second protection device based on the result of the analysis of the ionizing radiation.

16. The electronic device protection unit according to claim 1, wherein the analysis and control part is configured to control an operation of the electronic device based on the result of the analysis of the ionizing radiation.

17. An electronic system, comprising:

an electronic device; and an electronic device protection unit comprising:

a sensing part comprising an ionizing radiation detector configured to detect ionizing radiation with potential to cause destruction, failure, or malfunction of the electronic device;

a responding part configured to be able to perform a plurality of behaviors to protect the electronic device; and an analysis and control part configured to analyze the ionizing radiation based on an output of the ionizing radiation detector and control the behaviors of the responding part based on a result of the analysis of the ionizing radiation.

* * * * *